(12) United States Patent
Lee et al.

(10) Patent No.: US 8,444,906 B2
(45) Date of Patent: May 21, 2013

(54) METHOD OF CUTTING SUBSTRATE

(75) Inventors: Hyun-Chul Lee, Yongin (KR); Jin-Han Park, Yongin (KR); Joon-Hyung Kim, Yongin (KR); Won-Kyu Lim, Yongin (KR); Jae-Seok Park, Yongin (KR); Cheol-Lae Roh, Yongin (KR); Yong-Jin Lee, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 315 days.

(21) Appl. No.: 12/731,479

(22) Filed: Mar. 25, 2010

(65) Prior Publication Data
US 2010/0243623 A1    Sep. 30, 2010

(30) Foreign Application Priority Data
Mar. 25, 2009 (KR) .................. 10-2009-0025453

(51) Int. Cl.
*C03B 33/02* (2006.01)
*B23K 26/36* (2006.01)

(52) U.S. Cl.
USPC ............... 264/400; 264/482; 65/105; 65/112; 65/271; 65/273; 225/2; 225/96; 219/121.77

(58) Field of Classification Search
USPC .. 219/121.68, 121.69, 121.8, 121.85; 65/102, 65/105, 112, 152, 174, 268, 269, 271, 286, 65/287, 375, 97, 270; 438/460, 463; 225/2, 225/96; 264/400
See application file for complete search history.

(56) References Cited

U.S. PATENT DOCUMENTS

| | | | | |
|---|---|---|---|---|
| 5,720,894 A | * | 2/1998 | Neev et al. ...................... | 216/65 |
| 5,776,220 A | * | 7/1998 | Allaire et al. .................... | 65/112 |
| 5,841,099 A | * | 11/1998 | Owen et al. .............. | 219/121.69 |
| 6,552,301 B2 | * | 4/2003 | Herman et al. .......... | 219/121.71 |
| RE43,487 E | * | 6/2012 | O'Brien et al. ............... | 264/400 |
| 2006/0201983 A1 | | 9/2006 | Kusama et al. | |

FOREIGN PATENT DOCUMENTS

| | | |
|---|---|---|
| CN | 101218664 A | 7/2008 |
| JP | 57034346 A  * | 2/1982 |
| JP | 2001-089176 | 4/2001 |
| JP | 2005-132694 | 5/2005 |
| JP | 2007-118207 | 5/2007 |
| JP | 2007260773 A  * | 10/2007 |
| JP | 2008-142979 | 6/2008 |
| KR | 10-0347955 B1 | 7/2002 |
| KR | 10 2006-0030017 A | 4/2006 |
| KR | 10 2009-0006977 A | 1/2009 |

* cited by examiner

*Primary Examiner* — Samuel M Heinrich
(74) *Attorney, Agent, or Firm* — Lee & Morse, P.C.

(57) ABSTRACT

A substrate cutting method includes the steps of aligning a panel including two or more substrates, along a cutting line, forming groove lines in the respective substrates of the panel along the cutting line, by oscillating respective ultraviolet UV laser beams along the cutting line, and cutting the panel along the groove lines, by applying force to the panel.

16 Claims, 6 Drawing Sheets

METHOD OF CUTTING SUBSTRATE

CROSS-REFERENCE TO RELATED APPLICATION

This application claims the benefit of Korean Patent Application No. 10-2009-0025453, filed in the Korean Intellectual Property Office on Mar. 25, 2009, the disclosure of which is incorporated herein, by reference.

BACKGROUND

1. Field

The present teachings relate to a substrate cutting method.

2. Description of the Related Art

In order to cut a glass-based substrate, such as a base substrate of a flat panel display, into a desired product size, a variety of substrate cutting methods are currently used. A flat panel display can be an organic light emitting diode OLED display, a liquid crystal display LCD, or the like.

In general, a flat panel display includes a pair of opposing glass substrates. The glass substrates are generally spaced apart from each other by a predetermined gap. That is, in order to cut the flat display device, the glass substrates are cut simultaneously.

However, existing methods, such as methods using a blade or a laser beam, are problematic, in that the separation between the glass substrates makes simultaneously cutting the substrates difficult. In other words, the existing methods are problematic, in that while simultaneously cutting a pair of glass substrates, edge portions of one or both of the glass substrates are likely to be damaged during cutting.

The above information disclosed in this Background section is only for enhancement of understanding of the background of the described technology, and therefore, it may contain information that does not constitute prior art.

SUMMARY

The present teachings provide a substrate cutting method to effectively and stably cut a panel including a plurality of substrates.

A substrate cutting method, according to an exemplary embodiment of the present teachings, includes forming groove lines in substrates of a panel, along cutting lines, using oscillated ultraviolet (UV) laser beams, and separating the panel along the groove lines, by applying a force to the panel.

According to aspects of the present teachings, the groove lines may be depressed in the same direction and may overlap each other.

According to aspects of the present teachings, the force may be applied to the panel, in a direction opposite to the direction where the groove lines are depressed.

According to aspects of the present teachings, the laser beams may be oscillated within a predetermined beam irradiation sections of the cutting lines, while the beam irradiation sections are moved along the cutting lines.

According to aspects of the present teachings, each of the oscillated laser beams may have a wavelength of from about 200 nm to 900 nm.

According to aspects of the present teachings, the laser beams may be pulsed, and the laser beams may form the groove lines by physically removing portions of the substrates.

According to aspects of the present teachings, the laser beams may have a unit irradiation time that is shorter than about 50 picoseconds.

According to aspects of the present teachings, the laser beams may have a pulse frequency of from about 0.1 MHz to 100 MHz.

According to aspects of the present teachings, the substrate cutting method may further include disposing a buffer member on an opposite surface of the panel than to which the force is applied.

According to aspects of the present teachings, the substrate cutting method may further include inverting the panel, before the panel is separated.

According to aspects of the present teachings, the panel may include a first glass substrate, a second glass substrate, and sealants to bond the first glass substrate to the second glass substrate.

According to aspects of the present teachings, the laser beams may include a first laser beam that is oscillated on the first glass substrate, and a second laser beam that is oscillated on the second glass substrate.

According to aspects of the present teachings, the of forming of the groove lines may include the forming a first groove line on the first glass substrate, using the first laser beam, and forming a second groove line on the second glass substrate, using the second laser beam.

According to aspects of the present teachings, the second groove line may be formed after the first groove line is formed.

According to aspects of the present teachings, the first groove line and the second groove line may be formed simultaneously.

Additional aspects and/or advantages of the present teachings will be set forth in part in the description which follows and, in part, will be obvious from the description, or may be learned by practice of the present teachings.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EXEMPLARY EMBODIMENTS

Figure 1:
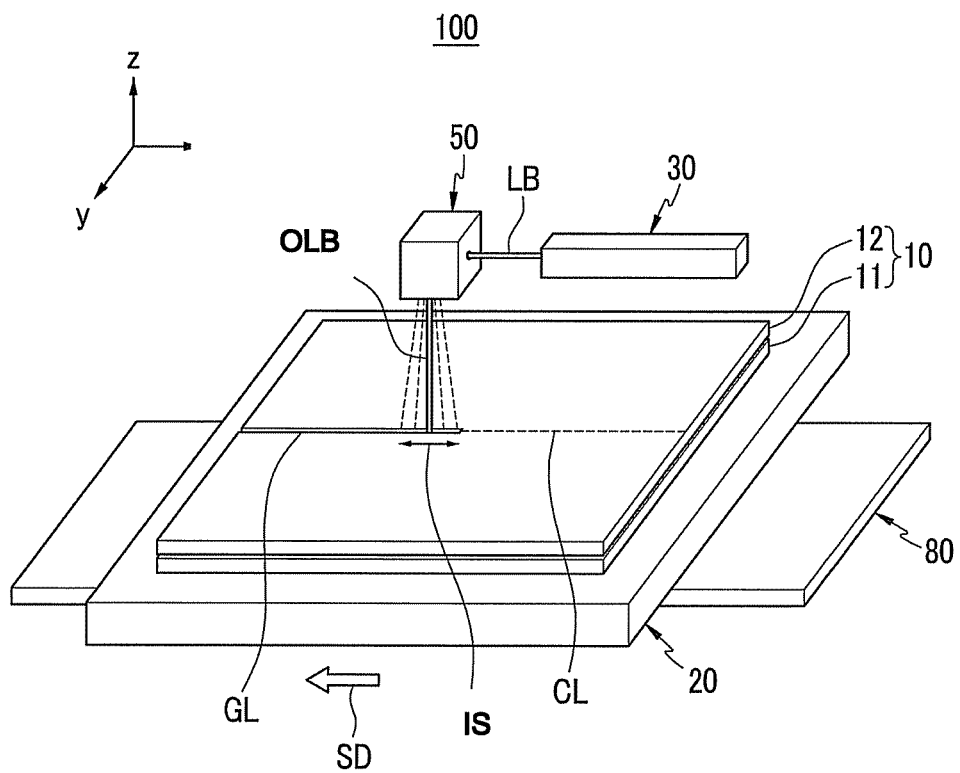
FIG. 1 is a perspective view of a substrate cutting apparatus, according to an exemplary embodiment of the present teachings.

Reference will now be made in detail to the exemplary embodiments of the present teachings, examples of which are illustrated in the accompanying drawings, wherein like reference numerals refer to the like elements throughout. The exemplary embodiments are described below, in order to explain aspects of the present teachings, by referring to the figures.

In the drawings, the thickness of layers, films, panels, regions, etc., are exaggerated for clarity. The thicknesses of the layers, films, panels, regions, etc., are enlarged in the drawings for better understanding and ease of description. It will be understood that when an element such as a layer, film, region, or substrate is referred to as being disposed "on" another element, it can be disposed directly on the other element, or intervening elements may also be present.

Hereinafter, a substrate cutting apparatus 100, according to an exemplary embodiment of the present teachings, is described with reference to FIG. 1. As shown in FIG. 1, the substrate cutting apparatus 100 includes a stage 20, a laser generator 30, a beam oscillator 50, and a transfer unit 80.

The stage 20 supports a panel 10 that will be cut along a cutting line CL. The panel 10 includes two or more substrates 11 and 12 that are joined together. While one cutting line CL is shown, cutting lines are formed in each of the substrates 11 and 12. Each of the substrates 11 and 12 is a glass substrate, i.e., can be made of a glass-based material. It is to be noted that the substrates 11 and 12 are not limited to glass substrates, and may be made of nonmetallic materials instead of glass.

The laser generator 30 emits an ultraviolet (UV) laser beam LB having a wavelength of from about 200 nm to 900 nm. The laser beam LB forms a groove line GL in each of the substrates 11 and 12, along the cutting line CL, by removing part of each of the substrates 11 and 12.

Further, the laser beam LB emitted from the laser generator 30 is pulsed. The laser beam LB has a unit irradiation time of less than about 50 picoseconds (ps) and a pulse frequency of from about 0.1 MHz to 100 MHz.

The beam oscillator 50 is disposed in the beam path of the laser beam LB and directs the laser beam LB onto the panel 10 in a reciprocating fashion, thereby forming an oscillated laser beam OLB. The beam oscillator 50 oscillates the laser beam LB by minutely varying a tilt angle of incidence of the laser beam LB, with respect to the panel 10. That is, the laser beam LB is oscillated within a predetermined beam irradiation section IS of the cutting line CL, by the beam oscillator 50. The beam irradiation section IS extends along the cutting line CL. Here, the tilt angle refers to an angle at which the oscillated laser beam OLB is incident on the surface of the panel 10. That is, the tilt angle of the laser beam LB, at which the laser beam LB is incident on the panel 10, is changed. Accordingly, an angle at which the oscillated laser beam OLB is incident on the surface of the panel 10 varies within a predetermined range. Further, the oscillated laser beam OLB is oscillated along the cutting line CL, within the beam irradiation section IS, i.e., in a straight line.

The oscillated laser beam OLB irradiates each of the substrates 11 and 12, thereby removing part of each of the substrates 11 and 12. Accordingly, the groove line GL is formed in each of the substrates 11 and 12. In more detail, the oscillated laser beam OLB is reciprocated within the beam irradiation section IS for several tens to several hundreds of times. The laser beam OLB physically removes portions of each of the substrates 11 and 12, by breaking molecular bonds within glass. Further, when the beam irradiation section IS is moved along the cutting line CL, the groove line GL is formed along the cutting line CL.

Figure 2:
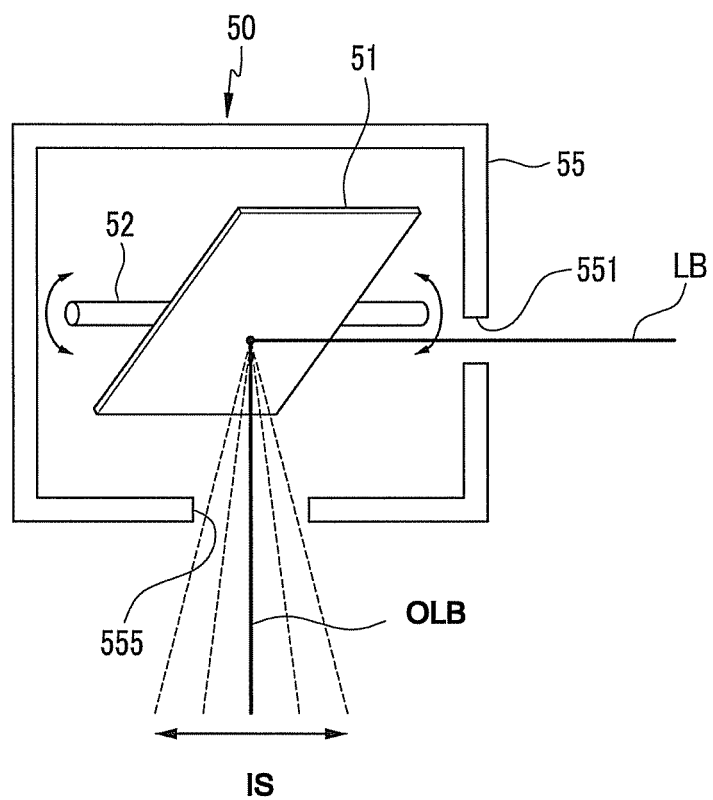
FIG. 2 is a schematic diagram showing a beam oscillator of FIG. 1.

The beam oscillator 50, as shown in FIG. 2, includes a reflector 51 for reflecting the laser beam LB emitted from the laser generator 30, and a driver 52 for driving the reflector 51. Although not shown, the driver 52 may further include a motor and a controller, in addition to the elements shown in FIG. 2. The driver 52 oscillates the laser beam LB that is emitted from the laser generator 30, by controlling the motion of the reflector 51. Here, the driver 52 may selectively control the motion of the reflector 51. That is, the driver 52 can control a swing width and a swing speed of the laser beam OLB, by controlling the motion of the reflector 51.

The beam oscillator 50 may further include a casing 55 for accommodating the reflector 51 and the driver 52. The casing 55 includes a beam inflow port 551 for introducing the laser beam LB that is emitted from the laser generator 30, and a beam irradiation port 555 for radiating the laser beam OLB that is oscillated by the reflector 51, toward the panel 10 (refer to FIG. 1). The swing width of the oscillated laser beam OLB can also be controlled through the size of the beam irradiation port 555.

Although not shown, the beam oscillator 50 may further include an optical unit disposed in the beam irradiation port 555, to focus the oscillated laser beam OLB within the beam irradiation section IS. The optical unit may focus of the oscillated laser beam OLB on each of the substrates 11 and 12. The optical unit may include at least one lens.

The optical unit may be a separate element from the beam oscillator 50. In particular, the optical unit 557 may be disposed between the laser generator 30 and the beam oscillator 50, or between the beam oscillator 50 and the panel 10. The beam oscillator 50 is not limited to the structure shown in FIG. 2. In other words, the beam oscillator 50 can oscillate the laser beam LB to the panel 10, through a variety of optical methods.

Referring back to FIG. 1, the transfer unit 80 transfers the stage unit 20, on which the panel 10 is mounted, in a direction SD that is parallel to the cutting line CL. That is, the beam irradiation section IS is moved along the cutting line CL, by the transfer unit 80, as the groove lines GL are formed in the substrates 11 and 12. Alternatively, the transfer unit 80 may move the beam oscillator 50 and the laser generator 30, rather than the stage unit 20.

A substrate cutting method, according to an exemplary embodiment of the present teachings, is described below with reference to FIGS. 3 to 6. The substrate cutting method is described as using the substrate cutting apparatus 100 shown in FIG. 1, but may be implemented using a different apparatus. Accordingly, those skilled in the art may implement the substrate cutting method using a variety of different substrate cutting apparatuses.

Figure 3:
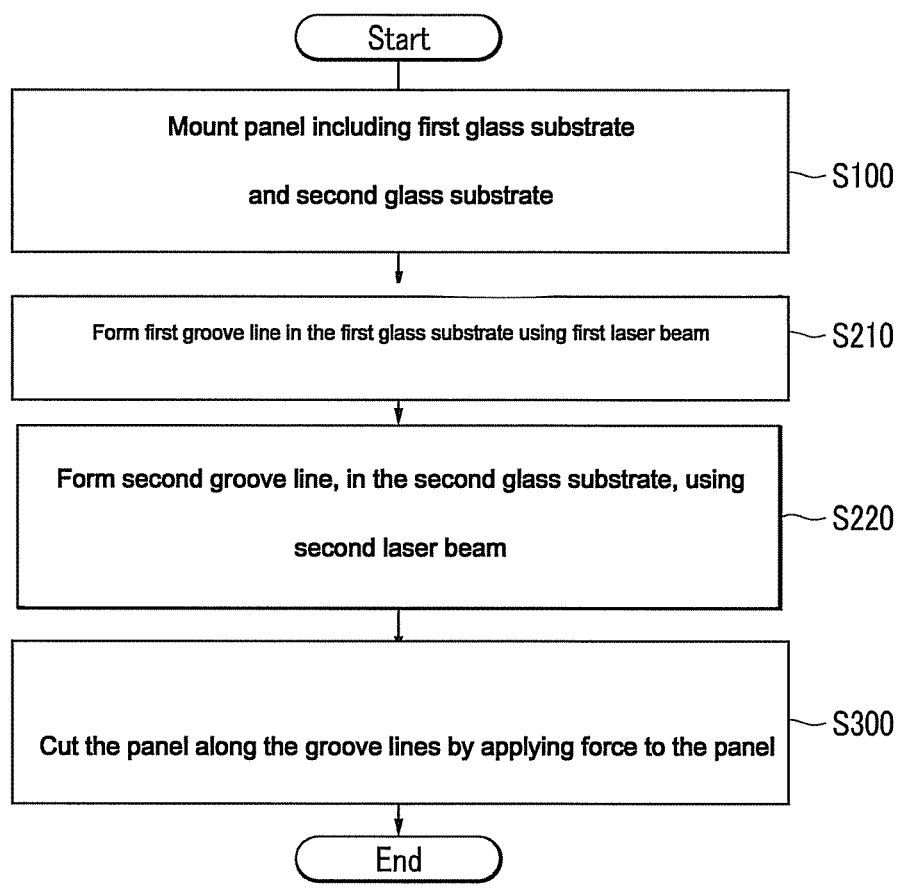
FIG. 3 is a flowchart illustrating a substrate cutting method, according to an exemplary embodiment of the present teachings.
Figure 4:
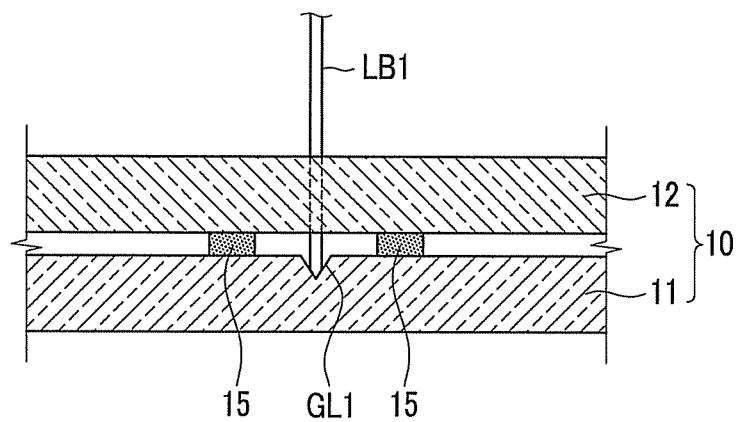
FIGS. 4 to 6 are cross-sectional views showing a substrate cutting method, according to an exemplary embodiment of the present teachings.

First, as shown in FIGS. 3 and 4, the panel 10, including the first glass substrate 11 and the second glass substrate 12, is mounted on the stage unit 20 and is aligned according to the cutting line CL, in operation S100. For example, as shown in FIG. 4, the panel 10 may include the first glass substrate 11 having an organic light emitting element formed therein. The second glass substrate 12 is bonded and sealed to the first glass substrate 11, and configured to protect the organic light emitting element. Sealants 15 are included to bond the first glass substrate 11 to the second glass substrate 12.

However, the present teachings are not limited to the above construction. For example, the panel 10 may include three or more substrates that are bonded together. That is, although not shown, the panel 10 may further include elements, such as a touch panel. Further, as described above, the panel 10 may include substrates made of nonmetallic materials other than glass.

Next, a first groove line GL1 is formed in the first glass substrate 11, using an oscillated first laser beam LB1, in operation S210. The first groove line GL1 is formed in a surface of the first glass substrate 11 that faces the second glass substrate 12. In other words, the first laser beam LB1 is radiated on the first glass substrate 11, through the second glass substrate 12. In this case, if the first laser beam LB1 is not precisely focused on the first glass substrate 11, the first groove line GL1 may not be precisely formed, because energy may be lost when the first laser beam LB1 passes through the second glass substrate 12.

Figure 5:
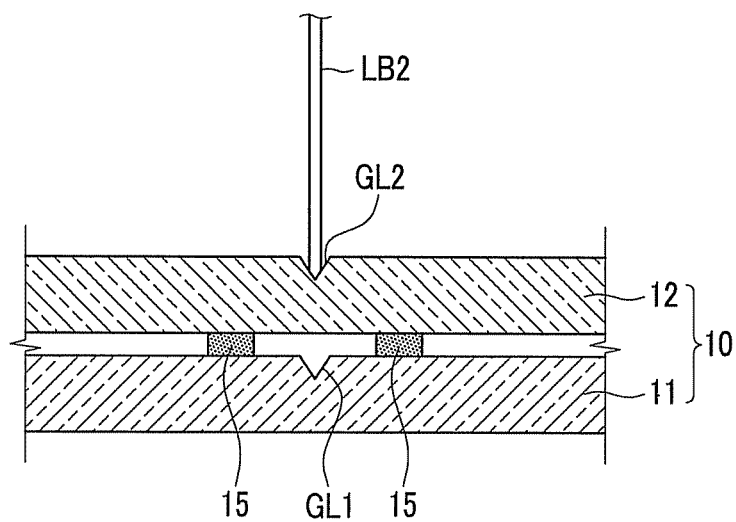

Next, as shown in FIG. 5, a second groove line GL2 is formed in the second glass substrate 12, using an oscillated second laser beam LB2, in operation S220. The second groove line GL2 is formed in a surface of the second glass substrate 12 that faces the first glass substrate 11. That is, the first groove line GL1 and the second groove line GL2 are depressed (concave) in the same direction. Further, the first groove line GL1 and the second groove line GL2 overlap each other along the cutting line CL (refer to FIG. 1). In other words, the first groove line GL1 and the second groove line GL2 overlap one another, when viewed in a direction orthogonal to the planes of the first and second substrates 11 and 12.

In the case where the panel 10 includes three or more substrates, the groove lines GL (refer to FIG. 1) can be formed in each of the substrates, using the above process. Here, the groove lines GL are depressed in the same direction and overlap one another, along the cutting line CL (refer to FIG. 1).

A UV laser beam having a wavelength of from about 200 nm to 900 nm is used as the first laser beam LB1 and the second laser beam LB2. Further, each of the first laser beam LB1 and the second laser beam LB2 is a pulse laser beam, having a unit irradiation time that is shorter than about 50 picoseconds and a pulse frequency of from about 0.1 MHz to 100 MHz. The first laser beam LB1 and the second laser beam LB2 are oscillated on respective regions on the first glass substrate 11 and the second glass substrate 12, several tens to several hundreds of times. Further, the oscillated first laser beam LB1 and the oscillated second laser beam LB2 form the first groove line GL1 and the second groove line GL2, respectively, by removing portions of the first glass substrate 11 and the second glass substrate 12, respectively.

Further, the beam oscillations of the first laser beam LB1 and the second laser beam LB2 may be implemented using the beam oscillator 50 shown in FIG. 1. Here, the first laser beam LB1 and the second laser beam LB2 are focused on the first glass substrate 11 and the second glass substrate 12, respectively.

The first laser beam LB1 and the second laser beam LB2 may be emitted from the same laser generator 30 (refer to FIG. 1) and oscillated by the same beam oscillator 50, or may be emitted from different laser generators 30 and beam oscillators 50.

Further, the first laser beam LB1 and the second laser beam LB2 are oscillated within the predetermined beam irradiation section IS. As described above with reference to FIG. 1, the beam irradiation section IS extends along the groove line GL that will be formed by the oscillated laser beam OLB, and is moved along the cutting line CL.

In the substrate cutting method, the groove lines GL can be effectively and stably formed in the respective substrates 11 and 12 of the panel 10 using the oscillated laser beam OLB. Unlike in the exemplary embodiment of the present teachings, in order to form the groove line GL using a general UV-based laser beam LB that has not been oscillated, a high-energy laser beam is continuously irradiated on one region. Accordingly, cracks are likely to locally occur in the substrates on which the laser beam radiated, because of heat impacts. The generated cracks are rarely controlled, and they can radiate randomly from a cutting line. The edges of a panel may be damaged by the random cracks, which may cause weakening of the panel.

According to the present teachings, however, the oscillated laser beam OLB is used, thereby reducing heat impact and the associated cracks. Thus, the energy level of the laser beam OLB can be increased. Consequently, the oscillated UV laser beam OLB can more stably form the groove lines GL in the respective substrates 11 and 12.

For example, the beam irradiation section IS may have a length of about 100 mm or less. Further, the oscillated laser beam OLB may be oscillated at a speed of about 0.1 m/s to 10 m/s, within the beam irradiation section IS. It is, however, to be noted that the length of the beam irradiation section IS and the oscillation speed of the oscillated laser beam OLB are only illustrative, and the present teachings is not limited thereto. In other words, the length of the beam irradiation section IS and the oscillation speed of the oscillated laser beam OLB can be properly controlled, according to the energy level of the laser beam OLB, such that the occurrence of cracks resulting from heat impact can be suppressed.

Figure 6:
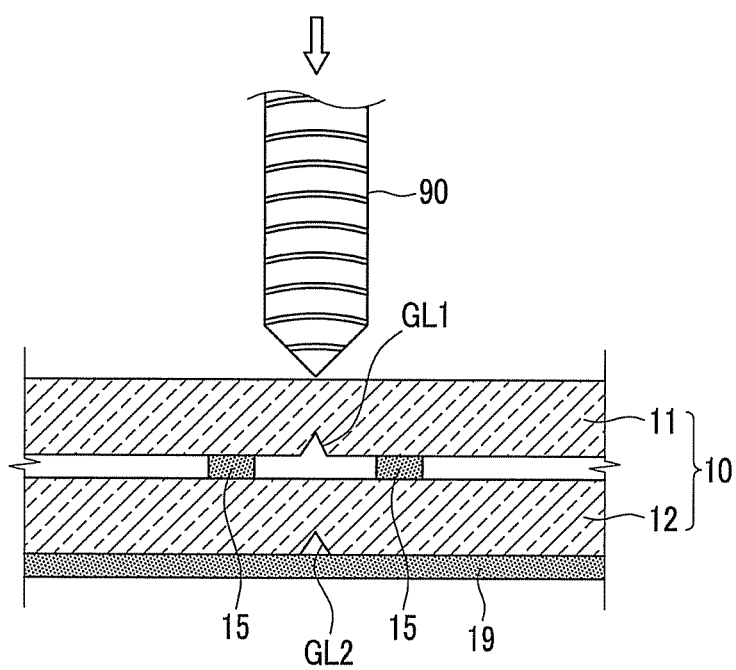

Next, as shown in FIG. 6, the panel 10 is cut along the groove lines GL1 and GL2, by applying force to the panel 10 in a direction opposite to the direction where the groove lines GL1 and GL2 are depressed, in operation S300. In this case, the force can be applied to the panel 10, by using a tool such as a breaker 90. On the other hand, as shown in FIG. 6, the front and rear surfaces of the panel 10 may be reversed before applying force to the panel 10, in order to facilitate the task, if appropriate.

Further, when the panel 10 is cut by the breaker 90, the panel 10 may be abruptly cut and damaged. Accordingly, a buffer member 19 may be additionally disposed on the opposite side of a surface of the panel 10 to which force is applied, in order to prevent damage to the panel 10 when the panel is cut. Through such a substrate cutting method, the panel 10 can be more effectively and stably cut.

In particular, in the substrate cutting method, according to the present teachings, the groove lines GL are formed in the respective substrates 11 and 12 by the oscillated UV-based laser beam OLB. Accordingly, the energy level of the oscillated laser beam OLB can be controlled in various ways. This means that panels of a variety of thicknesses can be cut using the substrate cutting method. Moreover, the present teachings, the panel 10 can be more stably cut, because local cracks resulting from heat impact can be prevented from occurring.

Hereinafter, an experimental example and a comparative example are described with reference to FIGS. 7 and 8. In the experimental example, a groove line was formed in a substrate using an oscillated UV laser beam, according to the exemplary embodiment of the present teachings. In the comparative example, a groove line was formed in a substrate using a general infrared laser beam that was not oscillated.

Figure 7:
FIGS. 7 and 8 are photographs showing groove lines formed in substrates, according to an experimental example of the present teachings and a comparative example.
Figure 8:
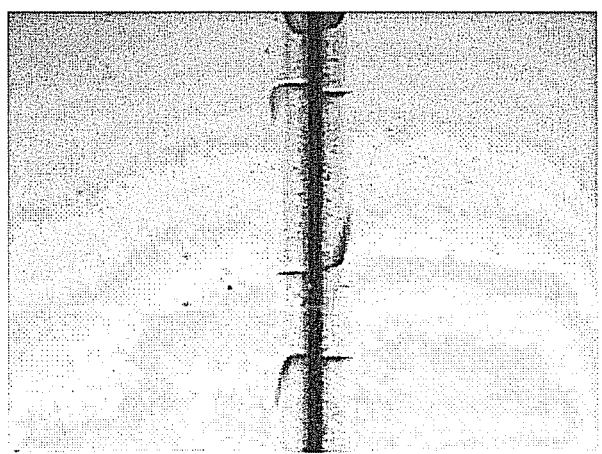

FIG. 7 shows the groove line formed in the substrate according to the experimental example, and FIG. 8 shows the groove line formed in the substrate according to the comparative example. From FIG. 7, it can be seen that the groove line formed in the substrate according to the experimental example was uniform and stable. Meanwhile, from FIG. 8, it can be seen that the groove line formed in the comparative example had many cracks at the edges of the substrate.

In order to form groove lines in substrates using a general UV laser beam that has not been oscillated, a laser beam of a high energy level must be continuously irradiated on one region. In this case, cracks are likely to occur, because of localized heat impact. The cracks are rarely controlled, and so may be randomly formed, even in a direction intersecting a cutting line. If the edges of the substrates are damaged by the random cracks, the overall strength of a panel is weakened.

However, as in the substrate cutting method according to an exemplary embodiment of the present teachings, cracks are not generated, so a stable cutting task can be performed. According to the present teachings, a panel can be effectively and stably cut.

Although a few exemplary embodiments of the present teachings have been shown and described, it would be appreciated by those skilled in the art that changes may be made in these exemplary embodiments, without departing from the principles and spirit of the present teachings, the scope of which is defined in the claims and their equivalents.

What is claimed is:

1. A substrate cutting method, comprising:
oscillating ultraviolet laser beams on first and second substrates of a panel along first and second cutting lines to form first and second groove lines in the first and second substrates, respectively; and
dividing the panel at the first and second groove lines by applying a force to the panel;
wherein oscillating the ultraviolet laser beams includes oscillating a first laser beam on a first beam irradiation section of the first substrate and simultaneously oscillating a second laser beam on a second beam irradiation section of the second substrate, the second beam irradiation section overlapping the first beam irradiation section when viewed in a direction orthogonal to planes of the first and second substrates.

2. The substrate cutting method of claim 1, wherein:
the first and second groove lines are formed in first surfaces of the respective first and second substrates, and the first surfaces of the first and second substrates face the same direction; and
the first and second groove lines overlap each other when viewed in a direction orthogonal to planes of the first surfaces.

3. The substrate cutting method of claim 2, wherein the force is applied to a second surface of one of the substrates, the second surface facing an opposite side as the first surfaces.

4. The substrate cutting method of claim 2, wherein the first and second beam irradiation sections are sections of the respective first and second cutting lines, and oscillating the ultraviolet laser beams includes
moving the first and second beam irradiation sections along the respective first and second cutting lines.

5. The substrate cutting method of claim 4, wherein the first and second laser beams have a wavelength of from about 200 nm to about 900 nm.

6. The substrate cutting method of claim 4, wherein:
the first and second laser beams are pulsed; and
the first and second laser beams form the first and second groove lines by removing portions of the first and second substrates, respectively.

7. The substrate cutting method of claim 6, wherein the first and second laser beams have a unit irradiation time of less than about 50 picoseconds.

8. The substrate cutting method of claim 6, wherein the first and second laser beams have a pulse frequency of from about 0.1 MHz to about 100 MHz.

9. The substrate cutting method of claim 3, wherein dividing the panel includes disposing a buffer member on the second surface of one of the substrates.

10. The substrate cutting method of claim 1, wherein oscillating the ultraviolet laser beams includes using different focal distances for each of the first and second laser beams.

11. The substrate cutting method of claim 1, wherein:
the first substrate is a glass substrate;
the second substrate is a glass substrate disposed to face the first substrate; and
sealants bond the first substrate to the second substrate.

12. The substrate cutting method of claim 1, further comprising inverting the panel on a stage prior to the dividing of the panel.

13. The substrate cutting method of claim 1, wherein oscillating the first laser beam includes the first laser beam passing through the second substrate.

14. The substrate cutting method of claim 1, wherein oscillating the first and second laser beams includes varying an angle of incidence of the first and second laser beams on the first and second substrates, respectively.

15. The substrate cutting method of claim 1, wherein the first and second laser beams are oscillated at a speed of about 0.1 m/s to about 10 m/s.

16. A substrate cutting method, comprising:
oscillating ultraviolet laser beams on substrates of a panel along cutting lines to form groove lines in the substrates;
dividing the panel at the groove lines by applying a force to the panel; and
inverting the panel on a stage prior to the dividing of the panel;
wherein:
the groove lines are formed in first surfaces of the substrates, the first surfaces facing the same direction;
the groove lines overlap each other when viewed in a direction orthogonal to planes of the first surfaces;
the force is applied to an opposing second surface of one of the substrates;
the oscillating of the laser beams includes:
oscillating the laser beams within beam irradiation sections of each of the cutting lines, and
moving the beam irradiation sections along the respective cutting lines;
the laser beams have a wavelength of from about 200 nm to about 900 nm;
the laser beams are pulsed;
the laser beams form the groove lines by removing portions of the substrates;
the laser beams have a unit irradiation time of less than about 50 picoseconds;
the laser beams have a pulse frequency of from about 0.1 MHz to about 100 MHz;
the dividing of the panel includes disposing a buffer member on an opposing second surface of one of the substrates;
the oscillating of the laser beams includes using different focal distances for each of the laser beams;
the panel includes:
a first glass substrate,
a second glass substrate disposed to face the first glass substrate, and
sealants to bond the first glass substrate to the second glass substrate; and
the oscillating of the laser beams includes:
oscillating a first laser beam on the first glass substrate,
forming a first groove line in the first glass substrate using the first laser beam,
oscillating a second laser beam on the second glass substrate, and
forming a second groove line in the second glass substrate using the second laser beam.

* * * * *